US007633322B1

(12) United States Patent
Zhuang et al.

(10) Patent No.: US 7,633,322 B1
(45) Date of Patent: Dec. 15, 2009

(54) DIGITAL LOOP CIRCUIT FOR PROGRAMMABLE LOGIC DEVICE

(75) Inventors: Jingcheng Zhuang, Dallas, TX (US); Qingjin Du, Dallas, TX (US); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 185 days.

(21) Appl. No.: 11/751,463

(22) Filed: May 21, 2007

Related U.S. Application Data

(60) Provisional application No. 60/922,135, filed on Apr. 6, 2007.

(51) Int. Cl.
*H03L 7/06* (2006.01)
(52) U.S. Cl. ........................................ 327/156; 327/147
(58) Field of Classification Search ........................ None
See application file for complete search history.

(56) References Cited

U.S. PATENT DOCUMENTS

| | | | | |
|---|---|---|---|---|
| 5,206,547 A * | 4/1993 | Houghten et al. | ............. | 377/81 |
| 5,648,744 A * | 7/1997 | Prakash et al. | ................. | 331/11 |
| 5,739,725 A * | 4/1998 | Ferraiolo et al. | .............. | 331/57 |
| 5,771,264 A * | 6/1998 | Lane | ........................... | 375/376 |
| 6,069,858 A * | 5/2000 | Endo et al. | ................... | 720/627 |
| 6,150,891 A * | 11/2000 | Welland et al. | ................ | 331/25 |
| 6,317,161 B1 * | 11/2001 | Renner et al. | ............... | 348/536 |
| 6,389,091 B1 * | 5/2002 | Yamaguchi et al. | ......... | 375/376 |
| 6,538,475 B1 * | 3/2003 | Johansen et al. | .............. | 327/12 |
| 6,597,249 B2 * | 7/2003 | Chien et al. | ............. | 331/177 R |
| 6,658,239 B1 * | 12/2003 | Elder et al. | .................. | 455/121 |
| 6,826,249 B1 * | 11/2004 | Younis | .......................... | 377/46 |
| 7,205,806 B2 * | 4/2007 | Chong et al. | .................. | 327/158 |
| 7,256,656 B2 * | 8/2007 | Wu | ............................... | 331/17 |
| 7,403,073 B2 * | 7/2008 | Kossel et al. | ................... | 331/16 |
| 2003/0002357 A1 * | 1/2003 | Kwon et al. | ................... | 365/194 |
| 2003/0210077 A1 * | 11/2003 | Khoury et al. | .................. | 327/2 |
| 2004/0202263 A1 * | 10/2004 | Choi | ........................... | 375/354 |
| 2005/0186920 A1 * | 8/2005 | Staszewski et al. | ....... | 455/114.1 |
| 2007/0002993 A1 | 1/2007 | Wang et al. | | |
| 2008/0266004 A1 * | 10/2008 | Denier et al. | ................ | 331/1 A |

OTHER PUBLICATIONS

Ferriss, M., et al., "A 14mW Fractional-N PLL Modulator with an Enhanced Digital Phase Detector and Frequency Switching Scheme," *2007 IEEE International Solid-State Circuits Conference*, Feb. 13, 2007, pp. 352-353, 608.

(Continued)

*Primary Examiner*—Lincoln Donovan
*Assistant Examiner*—Thomas J Hiltunen
(74) *Attorney, Agent, or Firm*—Ropes & Gray LLP; Jeffrey H. Ingerman

(57) ABSTRACT

A digital loop circuit—i.e., a phase-locked loop ("PLL") or delay-locked loop ("DLL")—having a simplified digital loop filter, is particularly well-suited for a programmable logic device ("PLD"). The loop filter may be a memory (e.g., a shift register) which counts the early/late or up/down signals from a phase detector or phase-frequency detector ("error detector") and outputs a signal when the count exceeds a threshold. Separate integral and proportional paths of the loop may include chained shift registers, with each outputting a signal only when the previous shift register overflows into it. A digital error detector may respond nonlinearly, with outputs of different bit widths, to different amounts of phase or frequency error.

45 Claims, 6 Drawing Sheets

OTHER PUBLICATIONS

Oh, D.-H., et al., "A 2.8Gb/s All-Digital CDR with a 10b Monotonic DCO," *2007 IEEE International Solid-State Circuits Conference*, Feb. 13, 2007, pp. 222-223, 598.

Rylyakov, A.V., et al., "A Wide Power-Supply Range (0.5V-to-1.3V) Wide Tuning Range (500 MHz-to-8 GHz) All-Static CMOS AD PLL in 65nm SOI," *2007 IEEE International Solid-State Circuits Conference*, Feb. 13, 2007, pp. 172-173.

Staszewski, R.B., et al., "Digitally Controlled Oscillator (DCO)-Based Architecture for RF Frequency Synthesis in a Deep-Submicrometer CMOS Process," *IEEE Transactions On Circuits And Systems—II: Analog And Digital Signal Processing*, vol. 50, No. 11, Nov. 2003, pp. 815-828.

Staszewski, R.B., et al., "Phase-Domain All-Digital Phase-Locked Loop" *IEEE Transactions On Circuits And Systems—II: Express Briefs*, vol. 52, No. 3, Mar. 2005, pp. 159-163.

Walker, R.C., "Designing bang-bang PLLs for clock and data recovery in serial data transmission systems," *Phase-locking in high-performance systems—from devices to architectures*, B. Razavi, Ed., pp. 34-45 (Wiley-IEEE Press, 2003).

* cited by examiner

DIGITAL LOOP CIRCUIT FOR PROGRAMMABLE LOGIC DEVICE

CROSS REFERENCE TO RELATED APPLICATION

This claims the benefit of commonly-assigned U.S. Provisional Patent Application No. 60/922,135, filed Apr. 6, 2007, which is hereby incorporated by reference herein in its entirety.

BACKGROUND OF THE INVENTION

This invention relates to digital loop circuits (i.e., phase-locked loops or delay-locked loops) having reduced complexity, and particularly to such loop circuits for use in a programmable logic device.

It is known to incorporate phase-locked loop ("PLL") and delay-locked loop ("DLL") circuitry on programmable logic devices ("PLDs"). For example, it has become common for PLDs to accommodate various input/output standards, some of which require very accurate high-speed clocks. One way of providing such clocks is to provide loop circuitry on the PLD. Although the discussion that follows may concentrate primarily on PLLs, the present invention is applicable equally to DLLs.

A basic PLL includes a phase-frequency detector ("PFD"), a charge pump, a loop filter and a voltage-controlled oscillator ("VCO"), connected in series. The input or reference frequency is one input to the PFD. The output of the VCO, which is the output of the PLL, is also fed back to another input of the PFD. If the feedback signal is not locked to the input reference signal, then the PFD output will be a signal (e.g., voltage) whose sign is indicative of whether the output leads or lags and whose magnitude is indicative of the amount of lead or lag. That signal is filtered by the charge pump and loop filter and is input to the VCO, causing the output frequency to change. Eventually, the output signal will lock to the phase of the input reference signal. In this simple example, the output signal also will lock to the frequency of the input reference signal, but in many PLLs, counters on the input and output of the PLL may be used to divide the input frequency, while a counter/divider in the feedback loop is used to multiply the input frequency. Thus the frequency of the output signal can be any rational multiple of the input frequency, but will be phase-locked to the input frequency.

The loop filter of a PLL also may have separate proportional and integral paths which may operate differently at different data rates or frequency ranges.

DLLs operate similarly, except that in a DLL, the phase-frequency detector normally found in a PLL is replaced with phase detector, and the VCO normally found in a PLL is replaced with a variable delay line.

Loop circuits are thus relatively large and complex circuits, and providing loop circuits on PLDs therefore either adds significant area to the PLD, or takes away area that could be used for programmable logic circuitry in a PLD of a given size. This is of further concern because the loop circuits that are provided may not be used in a particular user design, so that, as far as that user is concerned, the loop circuitry is simply wasted. Therefore, it would be desirable to be able to minimize the size and complexity of loop circuits.

SUMMARY OF THE INVENTION

The present invention provides loop circuitry on a programmable logic device that is of reduced size and complexity by providing an all-digital loop circuit. Thus, an all-digital PLL in accordance with the invention includes a digital phase detector or phase-frequency detector, a digital loop filter and a digitally-controlled oscillator (DCO). The digital phase detector or phase-frequency detector and digital loop filter also can be used in an all-digital DLL.

The digital loop filter preferably directly uses the phase detector or phase-frequency detector output signals and preferably provides a digital output that serves as the integral path, and as the input to a separate proportional path. The digital phase detector or phase-frequency detector preferably provides an extended error range by providing different digital output signals for different ranges of phase and/or frequency error.

Therefore, in accordance with the present invention, there is provided a digital loop circuit having an input terminal for receiving an reference signal having at least one of (a) a reference frequency and (b) a reference phase, and an output terminal for outputting an output signal that is at least one of (a) frequency-locked, and (b) phase-locked, to the reference signal. The digital loop circuit includes digital error-detecting circuitry that receives as inputs the reference signal and the output signal, and outputs a digital signal representing error in at least one of (a) frequency, and (b) phase, between the reference signal and the output signal. The digital loop circuit also includes digital loop filter circuitry including a memory that accumulates the error signal and outputs a control signal when the accumulated error exceeds a threshold. Digitally-controlled oscillator circuitry provides the output signal based on that control signal. Digital error-detecting circuitry for use in such a digital loop circuit, where the digital error-detecting circuitry responds nonlinearly to the error, thereby extending its range, is also provided, as is a programmable logic device incorporating such a loop circuit.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

Figure 1:
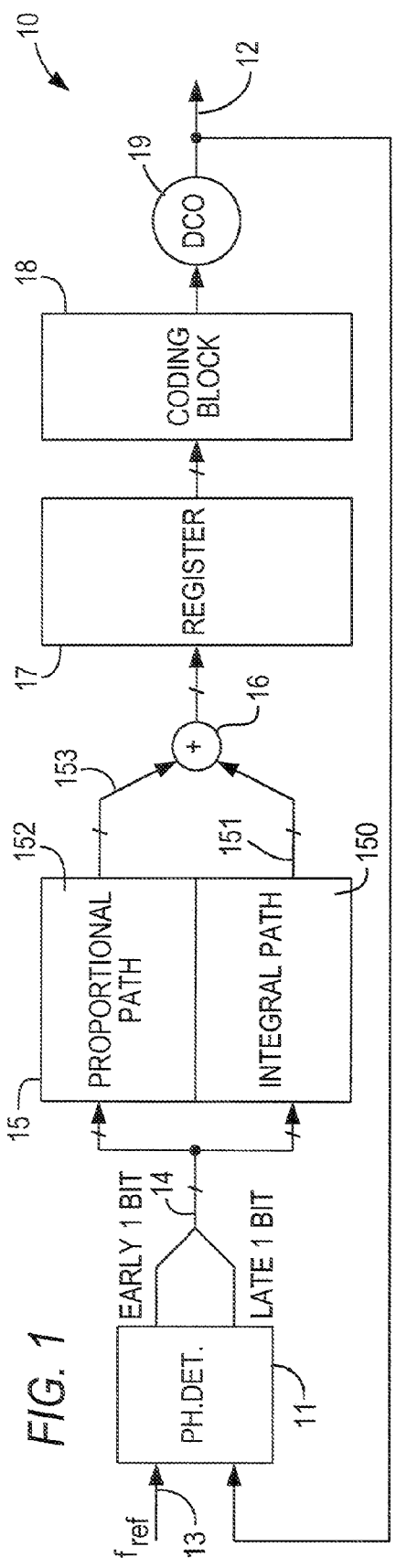
FIG. 1 is a block diagram of a previously known digital phase-locked loop circuit.

As described above, loop circuits such as PLLs are relatively large and complex. A traditional analog PLL includes a phase-frequency detector, a charge pump, a loop filter, and a voltage-controlled oscillator. Digital PLLs (DPPLs) are known, but known DPLLs remain large and complex, in part because they retain the various blocks of an analog PLL, but convert them, to varying degrees, to digital form. Thus, for example, a known digital loop filter may retain separate integral and proportional paths, necessitating a multi-bit adder to combine those paths into a single loop filter output.

In accordance with the present invention, a preferred embodiment of a substantially purely digital loop filter merely counts the early/late (i.e., retard/advance) signals from a digital phase detector, and outputs a signal to a digitally-controlled oscillator (DCO) only when the number of counts exceeds some threshold in one direction or the other. Known techniques could be applied to augment the digital phase detector with the capabilities of a digital phase-frequency detector. The digital loop filter can be implemented as a memory that stores the number of early/late signals, providing one net signal, and outputting a signal when the absolute value of that net signal exceeds a threshold. That threshold may be programmable, particularly when the DPLL is included in a PLD.

The digital loop filter could be implemented simply as a shift register, which shifts in one direction for "early" signals and in the opposite direction for "late" signals. For a threshold of n counts, the shift register could be made with length 2n+1 and loaded with all "0's," except for a "1" in the center position. That "1" would shift back and forth as the early and late signals arrived, but only after a net of n signals in the same direction would it be output. The end from which the "1" is output would indicate the direction (early or late). Any time a "1" is output at either end, the entire contents of the shift register can be reset to "0" so that there will be no further output until another n net counts. In a programmable logic device in particular, the size of the shift register, based on the desired n, is programmable. Other arrangements can be provided, including arrangements in which multiple bits are provided in parallel to the DCO.

In one embodiment, the DCO can include a respective digital-to-analog converter (DAC) for each input bit (assuming multiple parallel input bits), addition/integration circuitry to combine the incoming bits into an oscillator drive signal, and a conventional VCO. The addition/integration circuitry could be an array of varactors.

As stated above, according to another aspect of the invention, a digital phase detector or phase-frequency detector has a greater range than known phase detectors (PDs) or phase-frequency detectors (PFDs). This may be accomplished by providing a first output range (e.g., a one-bit output) for small phase or phase-frequency errors, a second, somewhat larger, output range (e.g., a two-bit output) for larger errors, and third, even larger, output range (e.g., a three-bit output) for even larger errors.

The invention will now be described with reference to FIGS. 1-7.

FIG. 1 shows a previously known "digital" PLL 10. Digital PLL 10 includes a digital PD/PFD 11 which outputs a signal 14 (or one or more bits) signifying whether the loop output 12 is early or late relative to the reference clock ($f_{ref}$) 13. Signal 14 is processed through separate integral and proportional paths 150, 152 of a digital loop filter 15 to provide separate signals 151, 153 that are added by adder 16 and registered in register 17 before being provided to digitally-controlled oscillator (DCO) 19 after encoding by coding block 18, which may provide a multi-bit control word for DCO 19.

Although PLL 10 is described as digital, it requires a large major analog component—i.e., adder 16.

Figure 2:
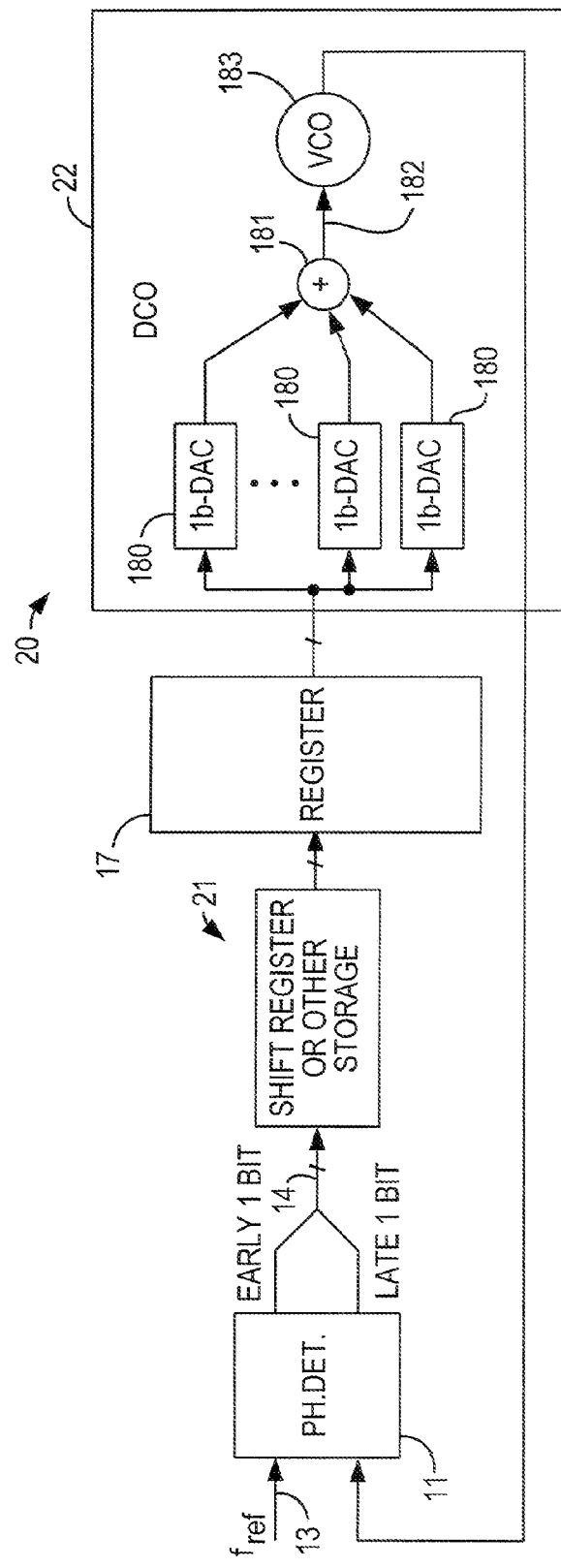
FIG. 2 is a block diagram of an exemplary digital phase-locked loop circuit in accordance with a preferred embodiment of the present invention.

In accordance with the present invention, a substantially truly digital PLL 20, shown in FIG. 2, replaces loop filter 15 with a loop filter 21 that could be simply a memory or shift register that counts the number of early/late or up/down signals from PD/PFD 11. For example, a shift register that outputs a signal each time a phase or phase-frequency error of magnitude n may function in the manner described above. The output of loop filter 21 may be registered at register 17 and provided to DCO 22.

DCO 22 preferably includes a one or more one-bit digital-to-analog converters (DACs) 180, an adder 181 to add the outputs of the DACs 180 to provide a voltage 182, and a conventional analog voltage-controlled oscillator (VCO) 183 driven by voltage 182. In accordance with the invention, then, the arithmetic function of adder 16 has been moved inside DCO 22. Moreover, adder 181 may be as simple as an array of varactors, which the output of each DAC 180 activating a respective one of the varactors to combine the various DAC outputs into a single voltage that controls VCO 183, performing the adder/integrator function more simply than adder 16.

In a simple embodiment of PLL 20, each of PD/PFD 11 and loop filter 21 output a one-bit signal, and therefore only one of DACs 180 in DCO 18 is required, and the addition/integration function 181 is not used to its full potential. However, in other embodiments, as described below, the output of PD/PFD 11 may be more than one bit.

Figure 3:
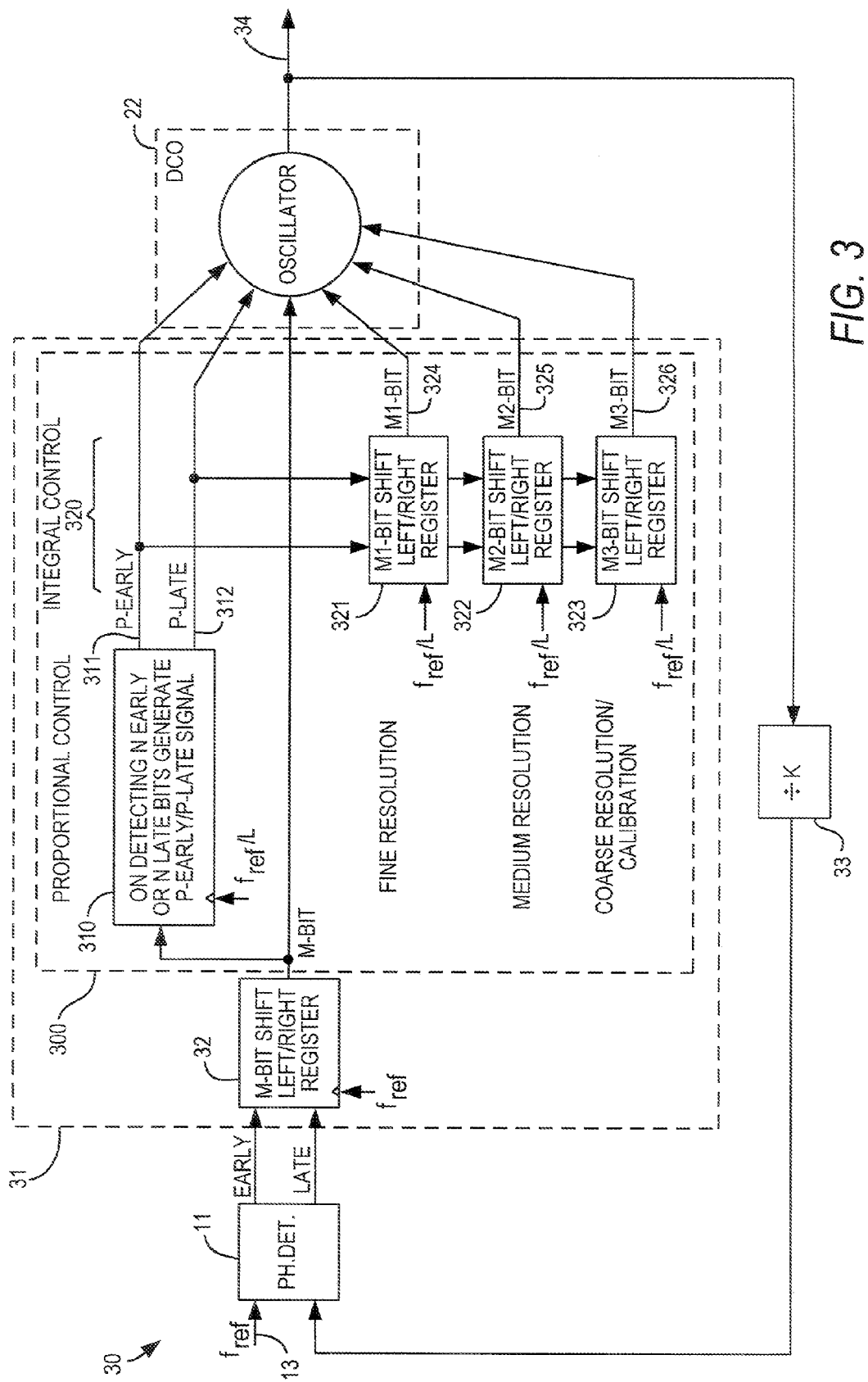
FIG. 3 is a block diagram of the phase-locked loop circuit of FIG. 2 showing more detail of a preferred embodiment of a digital loop filter in accordance with the present invention.

For example, as shown in PLL 30 of FIG. 3, loop filter 31 may include not only memory/shift register 32 with an output m bits wide, but also digital control circuitry 300, including proportional control 310 and integral control 320. Proportional control 310 may be simply a further shift register which outputs, as a single pulse only, a proportional early signal 311 or a proportional late signal 312 whenever N early or late signals, respectively, are detected from memory/shift register 32. Signals 311 and 312 are fed directly to DCO 22, and also are used in integral control 320. While memory/shift register 32 preferably is clocked by reference clock ($f_{ref}$) 13, proportional control 310 and integral control 320 preferably are clocked by $f_{ref}/L$, where L is a divisor to create a clock, slower than $f_{ref}$, to clock the proportional and integral paths.

Integral control 320 preferably includes three further shift registers 321, 322, 323, which provide fine, medium and coarse control, respectively, which preferably provide outputs of different bit widths. For example, fine-control shift register 321 may output an error signal 324 of a first bit width M1 (e.g., one bit) based on signals 311, 312. If the error is great enough, fine-control shift register 321 preferably overflows into medium-control shift register 322, which may provide a further error signal 325 of second bit width M2 (e.g., two bits). If the error is still greater, medium-control shift register 322 preferably overflows into coarse-control shift register 323, which may provide a further error signal 326 of third bit width M3 (e.g., three bits). It will be appreciated that insofar as signals 324, 325, 326 represent fine, medium and coarse resolution, preferably the frequency weight given to signal 326 is greater than the frequency weight given to signal 325, which is greater than the frequency weight given to signal 324. The particular weights may be user-programmable. Signals 311, 312, 324, 325, 326 may be combined in adder 181 of DCO 22. The output of memory/shift register 32 also may be provided to DCO 22 to be combined with signals 311, 312, 324, 325, 326.

FIG. 3 also shows feedback divider 33, which is used to multiply the frequency of output 34 for frequency synthesis as described above. Although not shown, PLL 20 (FIG. 2) also may include such a feedback divider, and both PLL 20 and PLL 30 can include input and output dividers (not shown) also used for frequency synthesis as described above.

Figure 4:
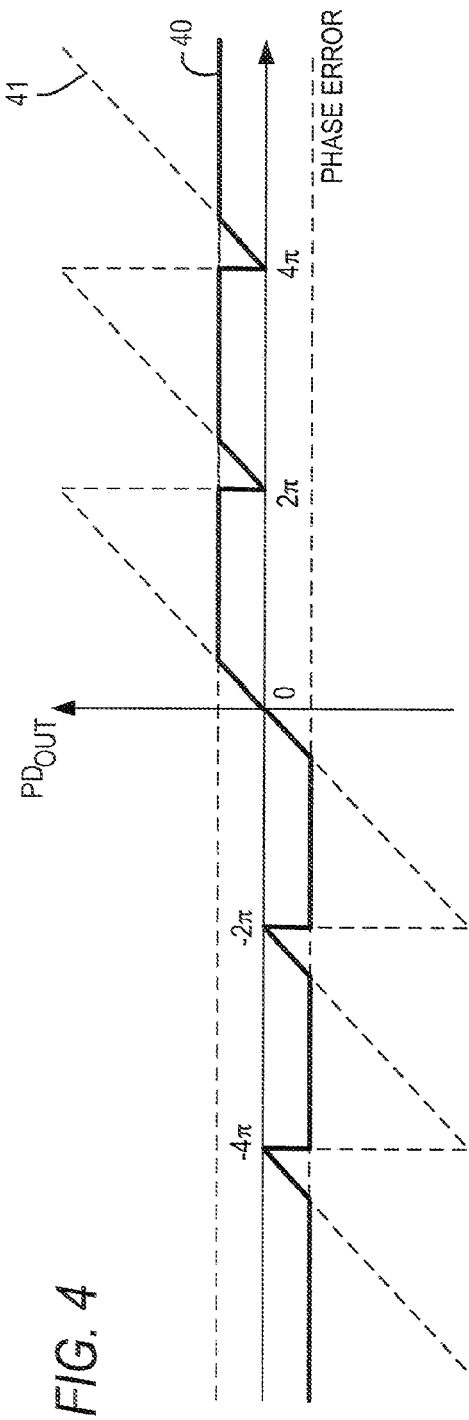
FIG. 4 is a graphic representation of the output characteristic of a phase-frequency detector in the embodiments of FIGS. 2 and 3.

PD/PFD 11 may have the output characteristic 40, shown in FIG. 4, which is linear in a small range of phase error, but which, compared to the analog error shown by dashed line 41, is clamped by the bit width of its output, resulting in a delay in frequency acquisition in PLLs 20, 30. Therefore, in accordance with another aspect of the present invention, a PD/PFD 50 (FIG. 5) with greater range is provided.

Figure 6:
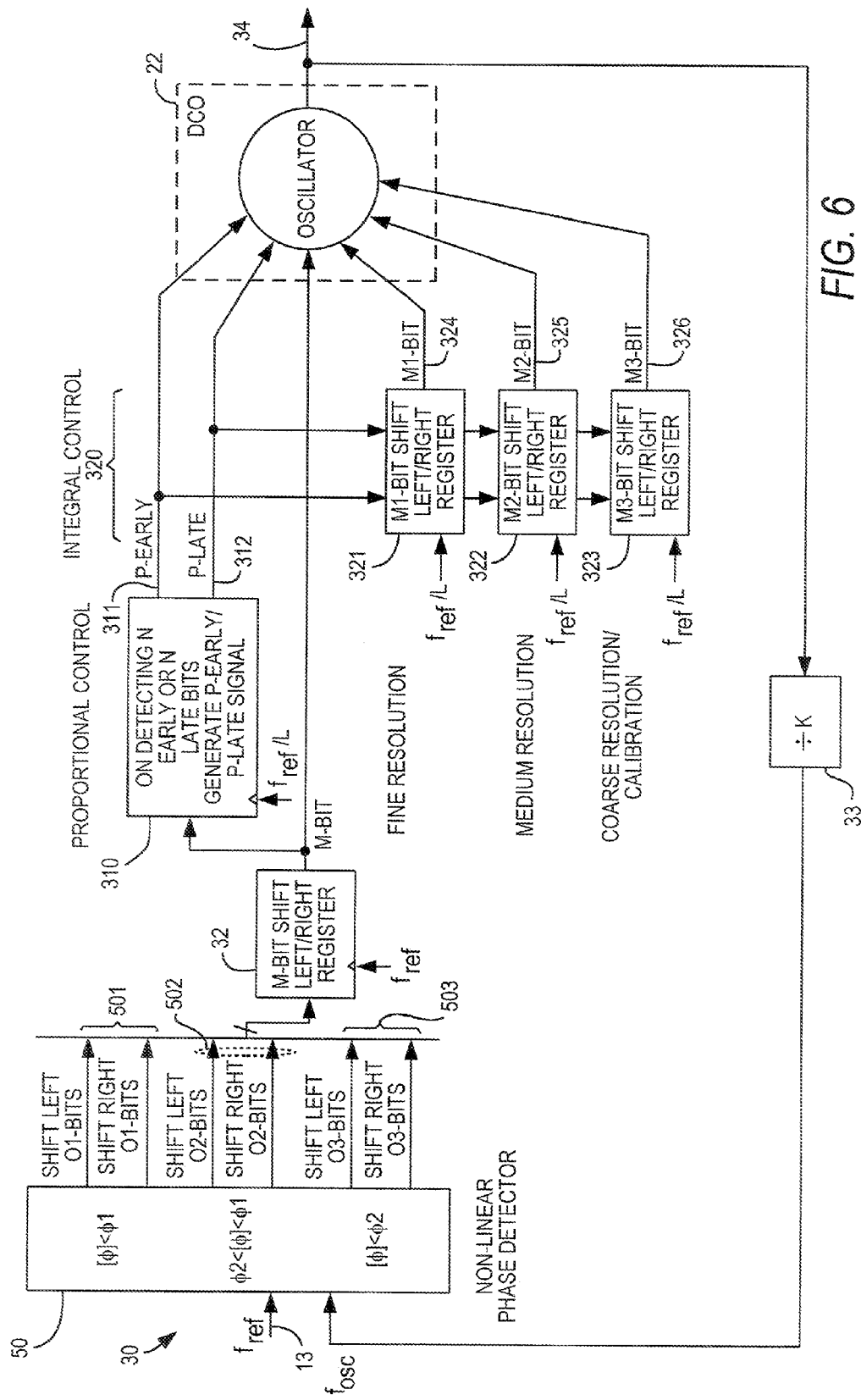
FIG. 6 is a schematic diagram of the phase-locked loop circuit of FIG. 3 incorporating a preferred embodiment of a nonlinear phase detector in accordance with the present invention.

As seen in PLL 60 (FIG. 6), PD/PFD 50, as determined by encoder and decision logic circuit 52, preferably has a first output 501 (which may have a first bit width—e.g., one bit) for small phase error ($|\phi|<\phi_1$), a second output 502 (which may have a second bit width—e.g., two bits) for intermediate phase error ($\phi_1<|\phi|<\phi_2$), and a third output 503 (which may have a third bit width—e.g., three bits) for large phase error ($|\phi|>\phi_2$). As shown in FIG. 6, each of the three outputs is actually two outputs—one for early signals and one for late signals.

In this embodiment, loop filter 61 includes not only proportional and integral controls 310, 320, but also memory/shift register 62, which preferably is an m-bit shift register where m is the width of the output of PD/PFD 50 (in this example, six bits).

Figure 7:
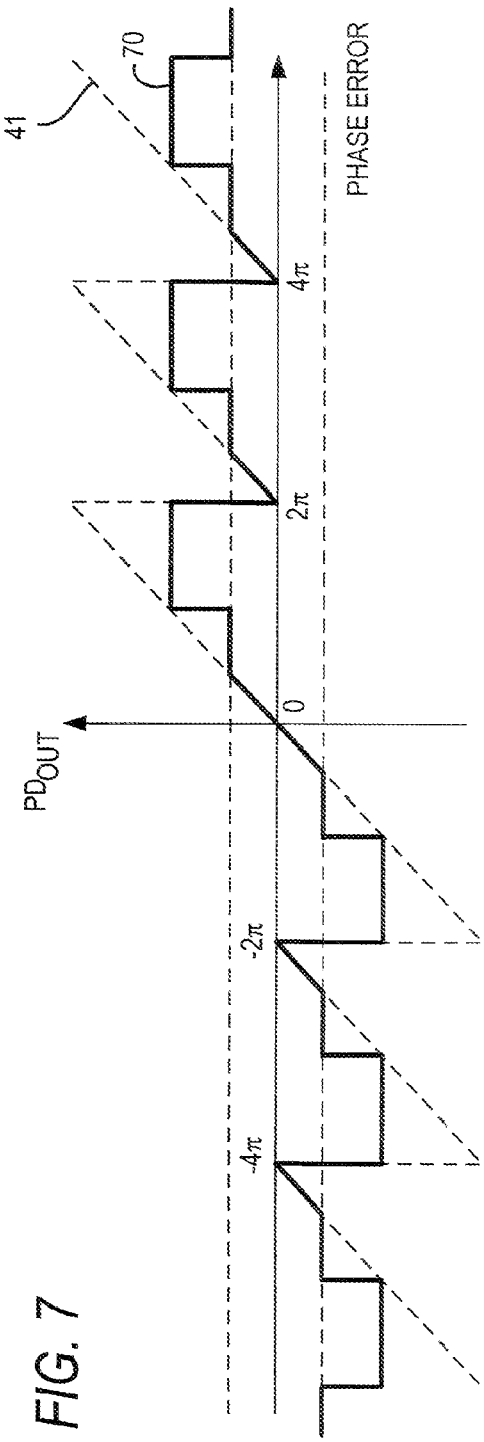
FIG. 7 is a graphic representation of the output characteristic of the phase-frequency detector of FIG. 5.
Figure 5:
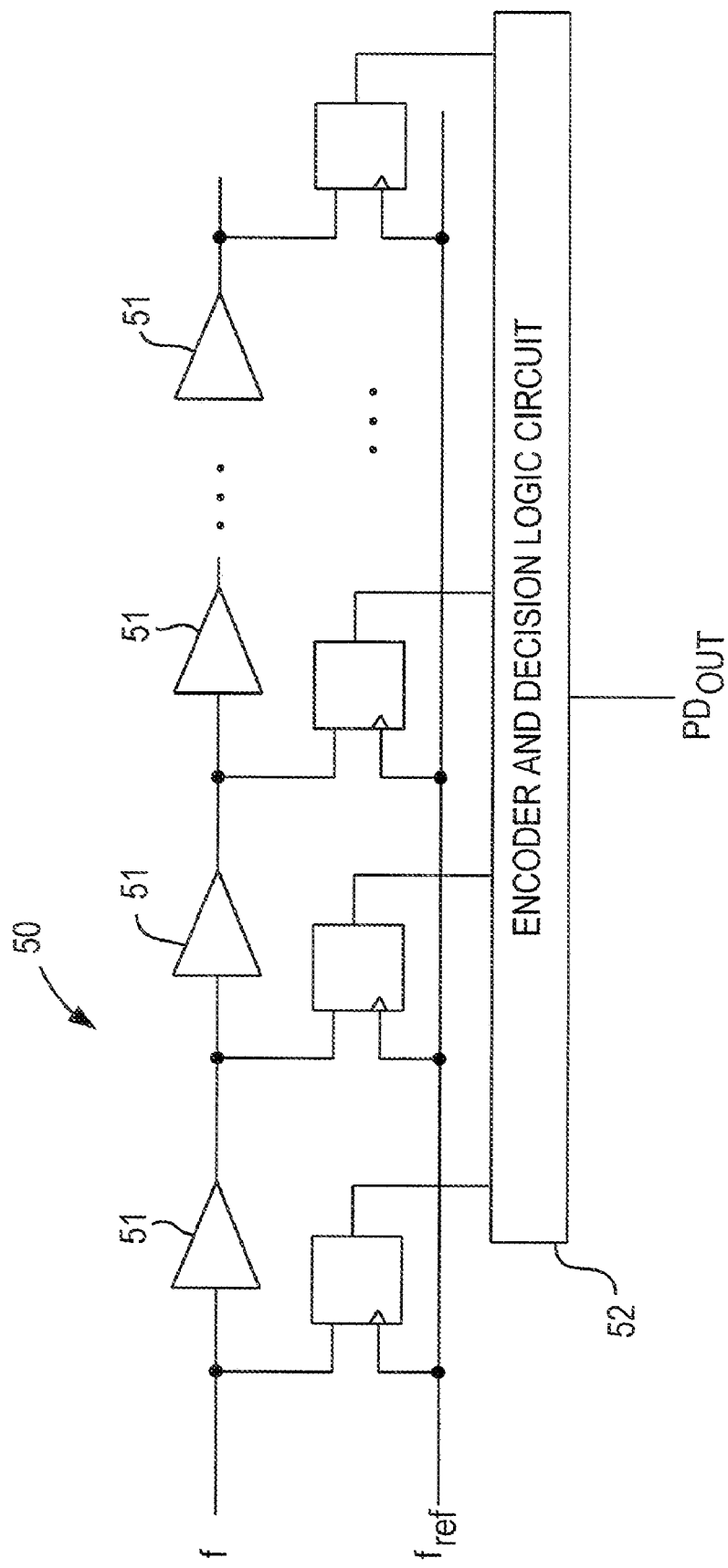
FIG. 5 is a schematic representation of a preferred embodiment of a phase-frequency detector in accordance with the present invention.

The output of PD/PFD 50 is a stepped phase-error signal 70 such as that shown in FIG. 7, where the size of each step is determined by the length of each delay 51. This stepped signal 70 more closely approximates the analog error 41.

As discussed above, although the invention has been described with reference to PLLs, it applies equally to DLLs. In the case of a DLL, whose purpose is to create equal delays, the proportional and integral controls 310, 320 preferably are connected to all taps of the DLL.

Thus it is seen that a digital loop circuit of reduced complexity, having an extended error range, has been provided.

Figure 8:
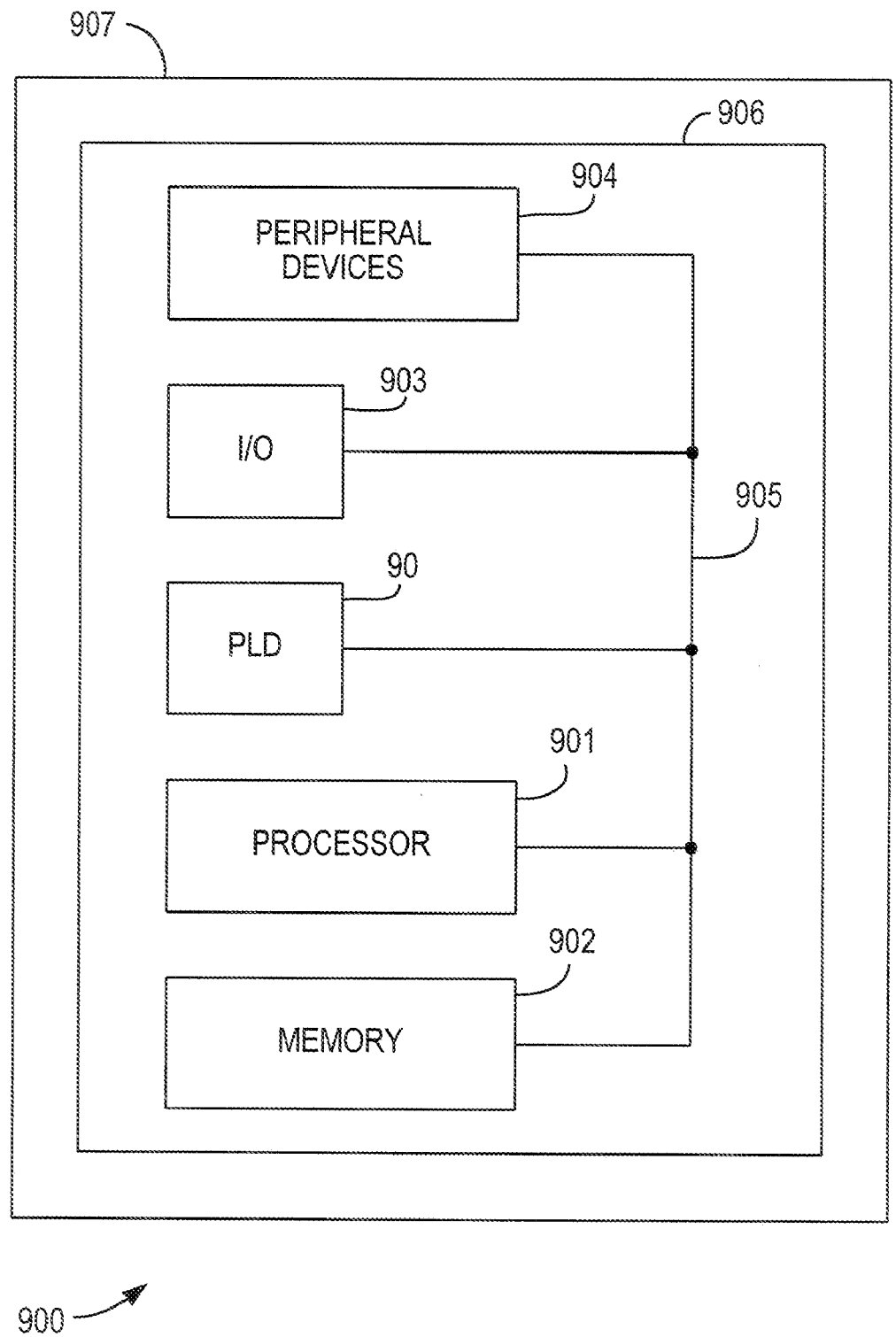
FIG. 8 is a simplified block diagram of an illustrative system employing a programmable logic device incorporating a loop circuit in accordance with the present invention.

A programmable logic device (PLD) 90 incorporating a loop circuit 20, 30, 60 according to the present invention may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A digital loop circuit having an input terminal for receiving a reference signal having at least one of (a) a reference frequency and (b) a reference phase, and an output terminal for outputting an output signal that is at least one of (a) frequency-locked, and (b) phase-locked, to said reference signal, said digital loop circuit comprising:

digital error-detecting circuitry receiving as inputs said reference signal and said output signal, and outputting a digital signal representing error in at least one of (a) frequency, and (b) phase, between said reference signal and said output signal;

digital loop filter circuitry comprising:

a first memory that accumulates said error signal and outputs a first control signal when said accumulated error exceeds a first accumulation threshold, a second memory that accumulates said first control signal and outputs a proportional control signal when said accumulated first control signal exceeds a second accumulation threshold, and additional memory that accumulates said proportional control signal and outputs an integral control signal when said accumulated proportional control signal exceeds a third accumulation threshold; and digitally-controlled oscillator circuitry that provides said output signal based on said first control signal and said proportional control signal.

2. The digital loop circuit of claim 1 wherein:

said loop circuit is a phase-locked loop; and said digital error-detecting circuitry is a phase-frequency detector.

3. The digital loop circuit of claim 1 wherein:

said loop circuit is a delay-locked loop; and said digital error-detecting circuitry is a phase detector.

4. The digital loop circuit of claim 1 wherein said first accumulation threshold is user-programmable.

5. The digital loop circuit of claim 1 wherein said first and second accumulation thresholds are user-programmable.

6. The digital loop circuit of claim 1 wherein said additional memory comprises a plurality of additional memories, each outputting a portion of said integral control signal representing a respective resolution.

7. The digital loop circuit of claim 6 wherein:

said plurality of additional memories comprises a chain of shift registers;

a first shift register in said chain receives said proportional control signal and outputs a fine-resolution portion of said integral control signal;

a second shift register in said chain receives overflow from said first shift register and outputs a medium-resolution portion of said integral control signal; and a third shift register in said chain receives overflow from said second shift register and outputs a coarse-resolution portion of said integral control signal.

8. The digital loop circuit of claim 7 wherein:

each of said fine-resolution, medium-resolution and coarse-resolution portions is given a respective frequency weight; and each said respective frequency weight is different from at least one other said respective frequency weight.

9. The digital loop circuit of claim 8 wherein said respective frequency weights are user-programmable.

10. The digital loop circuit of claim 7 wherein:

each of said fine-resolution, medium-resolution and coarse-resolution portions has a respective bit width; and each said respective bit width is different from at least one other said respective bit width.

11. The digital loop circuit of claim 10 wherein said respective bit widths are user-programmable.

12. The digital loop circuit of claim 1 wherein said digitally-controlled oscillator circuitry comprises circuitry for combining said proportional control signal and said integral control signal.

13. The digital loop circuit of claim 1 wherein said digital error-detecting circuitry responds nonlinearly to said error between said reference signal and said output signal.

14. A digital loop circuit
having an input terminal for receiving a reference signal having at least one of (a) a reference frequency and (b) a reference phase, and an output terminal for outputting an output signal that is at least one of (a) frequency-locked, and (b) phase-locked, to said reference signal, said digital loop circuit comprising:
digital error-detecting circuitry receiving as inputs said reference signal and said output signal, and outputting a digital signal representing error in at least one of (a) frequency, and (b) phase, between said reference signal and said output signal;
digital loop filter circuitry comprising a shift register that accumulates said error signal and outputs a control signal when said accumulated error exceeds a threshold; and
digitally-controlled oscillator circuitry that provides said output signal based on said control signal; wherein:
said shift register is loaded with a bit pattern in which a single particular bit representing said control signal is positioned a number of bit positions, corresponding to said threshold, from ends of said shift register; and
said accumulation of said error signal comprises shifting of said single particular bit until it reaches one of said ends of said shift register.

15. A digital loop circuit having an input terminal for receiving a reference signal having at least one of (a) a reference frequency and (b) a reference phase, and an output terminal for outputting an output signal that is at least one of (a) frequency-locked, and (b) phase-locked, to said reference signal, said digital loop circuit comprising:
digital error-detecting circuitry receiving as inputs said reference signal and said output signal, and outputting a digital signal representing error in at least one of (a) frequency, and (b) phase, between said reference signal and said output signal, wherein said digital error-detecting circuitry responds nonlinearly to said error between said reference signal and said output signal and has a first response characteristic for error between said reference signal and said output signal below a first error threshold, a second response characteristic for error between said reference signal and said output signal between said first error threshold and a second error threshold, and a third response characteristic for error between said reference signal and said output signal above said second error threshold;
digital loop filter circuitry comprising a memory that accumulates said error signal and outputs a control signal when said accumulated error exceeds a first accumulation threshold; and
digitally-controlled oscillator circuitry that provides said output signal based on said control signal.

16. The digital loop circuit of claim 15 wherein said first, second and third response characteristics comprise respective error signals having different respective bit widths.

17. The digital loop circuit of claim 15 wherein said first and second error thresholds are user-programmable.

18. Digital error-detecting circuitry for use in a digital loop circuit having an input terminal for receiving an reference signal having at least one of (a) a reference frequency and (b) a reference phase, an output terminal for outputting an output signal that is at least one of (a) frequency-locked, and (b) phase-locked, to said reference signal, wherein:
said digital error-detecting circuitry receives as inputs said reference signal and said output signal, and outputs a digital signal representing error in at least one of (a) frequency, and (b) phase, between said reference signal and said output signal, said digital error-detecting circuitry responding nonlinearly to said error between said reference signal and said output signal, and having a first response characteristic for error between said reference signal and said output signal below a first error threshold, a second response characteristic for error between said reference signal and said output signal between said first error threshold and a second error threshold, and a third response characteristic for error between said reference signal and said output signal above said second error threshold.

19. The digital error-detecting circuitry of claim 18 wherein:
said loop circuit is a phase-locked loop; and
said digital error-detecting circuitry is a phase-frequency detector.

20. The digital error-detecting circuitry of claim 18 wherein:
said loop circuit is a delay-locked loop; and
said digital error-detecting circuitry is a phase detector.

21. The digital error-detecting circuitry of claim 18 wherein:
each of said first, second and third response characteristics is given a respective frequency weight; and
each said respective frequency weight is different from at least one other said respective frequency weight.

22. The digital loop circuit of claim 21 wherein said respective frequency weights are user-programmable.

23. The digital error-detecting circuitry of claim 18 wherein said first, second and third response characteristics comprise respective error signals having different respective bit widths.

24. The digital error-detecting circuitry of claim 18 wherein said first and second error thresholds are user-programmable.

25. A programmable logic device comprising:
a digital loop circuit having an input terminal for receiving an reference signal having at least one of (a) a reference frequency and (b) a reference phase, an output terminal for outputting an output signal that is at least one of (a) frequency-locked, and (b) phase-locked, to said reference signal, said digital loop circuit comprising:
digital error-detecting circuitry receiving as inputs said reference signal and said output signal, and outputting a digital signal representing error in at least one of (a) frequency, and (b) phase, between said reference signal and said output signal;
digital loop filter circuitry comprising:
a first memory that accumulates said error signal and outputs a first control signal when said accumulated error exceeds a first accumulation threshold,
a second memory that accumulates said first control signal and outputs a proportional control signal when said accumulated first control signal exceeds a second accumulation threshold, and
additional memory that accumulates said proportional control signal and outputs an integral control signal when said accumulated proportional control signal exceeds a third accumulation threshold; and digitally-controlled oscillator circuitry that provides said output signal based on said first control signal and said proportional control signal.

26. The programmable logic device of claim 25 wherein said first accumulation threshold is user-programmable.

27. The programmable logic device of claim 25 wherein said first and second accumulation thresholds are user-programmable.

28. The programmable logic device of claim 25 wherein said additional memory comprises a plurality of additional memories, each outputting a portion of said integral control signal representing a respective resolution.

29. The programmable logic device of claim 28 wherein:
said plurality of additional memories comprises a chain of shift registers;
a first shift register in said chain receives said proportional control signal and outputs a fine-resolution portion of said integral control signal;
a second shift register in said chain receives overflow from said first shift register and outputs a medium-resolution portion of said integral control signal; and
a third shift register in said chain receives overflow from said second shift register and outputs a coarse-resolution portion of said integral control signal.

30. The programmable logic device of claim 29 wherein:
each of said fine-resolution, medium-resolution and coarse-resolution portions is given a respective frequency weight; and
each said respective frequency weight is different from at least one other said respective frequency weight.

31. The programmable logic device of claim 30 wherein said respective frequency weights are user-programmable.

32. The programmable logic device of claim 29 wherein:
each of said fine-resolution, medium-resolution and coarse-resolution portions has a respective bit width; and
each said respective bit width is different from at least one other said respective bit width.

33. The programmable logic device of claim 32 wherein said respective bit widths are user-programmable.

34. The programmable logic device of claim 25 wherein said digitally-controlled oscillator circuitry comprises circuitry for combining said proportional control signal and said integral control signal.

35. The programmable logic device of claim 25 wherein said digital error-detecting circuitry responds nonlinearly to said error between said reference signal and said output signal.

36. A digital processing system comprising:
processing circuitry;
a memory coupled to said processing circuitry; and
a programmable logic device as defined in claim 25 coupled to the processing circuitry and the memory.

37. A printed circuit board on which is mounted a programmable logic device as defined in claim 25.

38. The printed circuit board defined in claim 37 further comprising:
memory circuitry mounted on the printed circuit board and coupled to the programmable logic device.

39. The printed circuit board defined in claim 38 further comprising:
processing circuitry mounted on the printed circuit board and coupled to the memory circuitry.

40. A programmable logic device comprising:
a digital loop circuit having an input terminal for receiving an reference signal having at least one of (a) a reference frequency and (b) a reference phase, an output terminal for outputting an output signal that is at least one of (a) frequency-locked, and (b) phase-locked, to said reference signal, said digital loop circuit comprising:
digital error-detecting circuitry receiving as inputs said reference signal and said output signal, and outputting a digital signal representing error in at least one of (a) frequency, and (b) phase, between said reference signal and said output signal;
digital loop filter circuitry comprising a shift register that accumulates said error signal and outputs a control signal when said accumulated error exceeds a threshold; and
digitally-controlled oscillator circuitry that provides said output signal based on said control signal; wherein:
said shift register is loaded with a bit pattern in which a single particular bit representing said control signal is positioned a number of bit positions, corresponding to said threshold, from ends of said shift register; and
said accumulation of said error signal comprises shifting of said single particular bit until it reaches one of said ends of said shift register.

41. A programmable logic device comprising:
a digital loop circuit having an input terminal for receiving an reference signal having at least one of (a) a reference frequency and (b) a reference phase, an output terminal for outputting an output signal that is at least one of (a) frequency-locked, and (b) phase-locked, to said reference signal, said digital loop circuit comprising:
digital error-detecting circuitry receiving as inputs said reference signal and said output signal, and outputting a digital signal representing error in at least one of (a) frequency, and (b) phase, between said reference signal and said output signal;
digital loop filter circuitry comprising a memory that accumulates said error signal and outputs a control signal when said accumulated error exceeds a threshold, wherein said digital error-detecting circuitry responds nonlinearly to said error between said reference signal and said output signal and has a first response characteristic for error between said reference signal and said output signal below a first error threshold, a second response characteristic for error between said reference signal and said output signal between said first error threshold and a second error threshold, and a third response characteristic for error between said reference signal and said output signal above said second error threshold; and
digitally-controlled oscillator circuitry that provides said output signal based on said control signal.

42. The programmable logic device of claim 41 wherein:
said first, second and third response characteristics comprise respective error signals;
each of said respective error signals is given a respective frequency weight; and
each said respective frequency weight is different from at least one other said respective frequency weight.

43. The programmable logic device of claim 42 wherein said respective frequency weights are user-programmable.

44. The programmable logic device of claim 41 wherein said first, second and third response characteristics comprise respective error signals having different respective bit widths.

45. The programmable logic device of claim 44 wherein said respective bit widths are user-programmable.

* * * * *